United States Patent
McLaughlin

[11] 4,344,150
[45] Aug. 10, 1982

[54] COHERENT NOISE CANCELLING FILTER

[75] Inventor: George H. McLaughlin, Tucson, Ariz.

[73] Assignee: Newmont Mining Corporation, New York, N.Y.

[21] Appl. No.: 168,190

[22] Filed: Jul. 10, 1980

[51] Int. Cl.$^3$ .............................................. G06F 15/31
[52] U.S. Cl. .................................................... 364/724
[58] Field of Search .............. 364/724, 825; 343/5 DP

[56] References Cited

U.S. PATENT DOCUMENTS

| | | | |
|---|---|---|---|
| 3,614,626 | 10/1971 | Dillard | 343/5 DP X |
| 3,780,279 | 12/1973 | Stover | 364/724 |
| 3,894,219 | 7/1975 | Weigel | 343/5 DP X |

OTHER PUBLICATIONS

Harden, "Digital Filters With IC's Boost Q Without Inductors", *Electronics*, Jul. 24, 1967, pp. 91-100.
Visel, "Narrowband Digital Filter Achieves High Q's", *Electronics*, Nov. 22, 1973, p. 118.

*Primary Examiner*—David H. Malzahn

[57] ABSTRACT

Apparatus and method for removing coherent noise from an electrical signal, such as powerline noise, and operating in real time. An operational amplifier with digital filter and a low pass filter in the feedback loop, with the digital filter providing a feedback signal corresponding to the coherent noise in the absence of the desired signal. In the preferred embodiment, an integrating type digital filter with digital memory, and alternative embodiments with condenser memory.

29 Claims, 8 Drawing Figures

St - RECEIVED TRANSMITTER SIGNAL
S - DESIRED ANOMALOUS SIGNAL
N - COHERENT NOISE SIGNAL

COHERENT NOISE CANCELLING FILTER

BACKGROUND OF THE INVENTION

This invention relates to method and apparatus for removing coherent noise from an electrical signal, such as powerline noise, with the noise cancelling taking place in real time. That is, the noise cancellation occurs at the time the echo signal is received, rather than being performed at a later time on previously recorded signal data.

Typical applications of the invention are in the field of noise cancellation in radar, sonar and seismic echos. In a typical system electromagnetic pulses of high energy are periodically transmitted from a source and in the interval between transmission pulses, echos are detected and recorded or displayed at a receiver, providing information on objects in the path of the transmitted pulses. The echo signals are often faint and the relevant information in the received echo is often masked by noise, including coherent noise from various sources such as powerlines, generators, and the like. One such pulse transmission and receiving system is described in U.S. Pat. No. 3,263,160, and one of the objects of the present invention is to provide a new and improved coherent noise cancelling filter and process for filtering suitable for removing or cancelling coherent noise in the received signals of the system such as is disclosed in said patent, as well as in other radar, sonar and seismic type of systems.

Coherent noise refers to a noise from an electrical source which has a fundamental frequency and harmonics, and the level of the noise as well as the frequency should be substantially constant over a relatively short period which depends upon the time constant of the filter, but typically is in the order of a few seconds.

The problem of coherent noise in an echo detecting system is not new. In a typical detecting system, the signal sensor responds both to the signal S and coherent noise N. A typical waveform obtained at the receiver is illustrated in FIG. 1. In operation, the attitude and/or the location of the sensor may be changed with each reading, which in turn varies S and N independently of each other. In geophysical exploration and the like, the detecting system is utilized in a variety of terrain, and light weight and ease of mobility are desirable characteristics. The party utilizing the equipment has no choice for placement and hence has to operate in areas where electromagnetic fields from powerlines, generators and the like produce considerable coherent noise.

The detecting system employs a time-domain principle. The transmitter is located at a fixed position and produces an electromagnetic field pulse of known rectangular form. The sensor responds to this field to give a signal St. The desired anomalous signal S occurs during a period after St. There is a period of time Tn before the next transmitter pulse when only the noise N is present. The anomalous signals are of a decaying form (an exponential is illustrated). The form of the reading must be recorded for interpretation and its interpretive value is related to the dynamic range of the recording. Noise restricts the lower dynamic range. The desirable dynamic range is of the order of 1000:1. It should be noted that St from the sensor varies with attitude and location of the sensor. The ratio of the received maximum transmitted signal St to the received maximum anomalous signal S' can be greater than 1000.

To economically define the signal for recording, quasi-logarithmic compression normally is used. At low levels, the response is linear. At high levels the response is logarithmic and known. This compression provides an approximated constant percentage resolution. Also, it assists in the time recovery of the high overload of the transmitted signal St. The amplifier should have little or no phase or time distortion over a band 0–10,000 Hz.

Similar noise problems exist for other systems employing electrical potential or electromagnetic sensors. These systems have practical acceptance but there is demand for their use in developed areas where these noise problems exist. It is desirable to have a modification or a separate addition for these systems to extend their utility. This approach can minimize equipment inventory and maintain standard operating procedures. It is an object of the present invention to provide method and apparatus suitable for use with such systems for cancelling the coherent noise.

Attempts have been made in the past to overcome this problem, but have not been satisfactory with modern day equipment. The older designs of geophysical equipment operate on a continuous signal or frequency domain principle at discrete frequencies. The noise in these systems can be reduced by choice of operating frequencies and use of accepted filter technology. The newer designs of instruments operate on an intermittent or time-domain principle. The transmitted signal and the desired received signals occur at different time periods. These systems are cost effective for broad spectrum analysis. The sensors and processing of the received signals require a broad frequency response for the spectrum of interest. It is not practical to remove the man-made noise with conventional band rejection filters. This filtering introduces discontinuities in the passband of the signal and degrades the results.

Computers have been used to filter signal records. Preferably this requires a continuous digital record of the signal at equal time intervals. Filtering in this manner requires a high degree of absolute accuracy in the digital records since calculations involve the differences of large numbers. This accuracy, when combined with the requirements of a large dynamic signal level, results in a very sophisticated signal processing, and an increase in data handling by more than two orders of magnitude. This approach is expensive, and does not provide a filtered signal in real time for examination in the field.

Some of the existing geophysical systems use a very simplified but similar technique to provide filtering for coherent noise. The signal S+N (FIG. 1) is evaluated at known intervals during Ts. At a later time which is an integral multiple of 1/Fn and during Tn, the noise N is evaluated at the same known intervals. The readings of N are substracted from the corresponding readings of S+N to provide S. This provides results comparable to computer filtering but with reduced accuracy in the evaluation of N. This alleviates the volume of data handling but demands the same degree of incremental accuracy prior to evaluation of N and S+N.

One solution of the problem is to introduce a noise cancelling signal with the sensor at the input. Attempts have been made to utilize a second sensor to provide this signal. This sensor must reproduce the coherent noise with no signal S present. This is difficult since both S and N field patterns can have elliptical polarization. A balancing network is required for the noise sensor to adjust amplitude and phase of the noise and this restricts practical cancellation to a single frequency component. Cancellation can be obtained also from a single frequency artificial noise source. There is no knowledge of automation of these methods. These methods result in a relatively large time lapse between their adjustment and use of the cancelling signal. None of these methods is cost effective and have been used when results are essential in areas where approximate cancellation of noise justifies the results.

The standard procedure of sampling time-domain signals and noise reduction by "stacking" results is not suitable for the present problem. The effect of these procedures is dependent on incremental accuracy preceding their application.

A further object of the invention is to provide for noise cancellation at a low linear signal level and in real time.

Standard filtering is not satisfactory. The performance of conventional continuous wave (CW) filters is based on a continuous input. A series of CW band rejection or notch filters for Fn would be required. If time-domain signals such as St, S, were fed to such a CW filter combination, the continuous coherent noise would be removed but it would be impossible to recover the signal S.

The signal St can be 1000 times the desired signal S. The output due to St would have amplitude of the order of S and would "ring" (decaying oscillations) at the rejection frequencies. This "ringing" would extend St into the time band of S. The noise effect of this time distortion of St could be greater than the coherent noise which is rejected. The conventional CW filter has no storage capability and cannot be gated.

It is a particular object of the invention to provide method and apparatus for cancelling the coherent noise signal N with an identical signal N' before any nonlinear amplification is performed, with the cancelling signal N' having the character of the coherent noise signal during the period Tn and being independent of St and S. This may be achieved by storing the coherent noise signal during the period Tn for continuous reproduction to provide the desired cancelling signal N'. A particular object of the invention is to provide such a system utilizing an integrating type digital filter with digital memories in a feedback circuit of an operational amplifier. A further object is to provide such a system in an alternative embodiment incorporating condenser memory. An additional object of the invention is to provide such a system incorporating a means for advancing timing in the feedback circuit to compensate for a time delay in the system.

Other objects, advantages, features and results will more fully appear in the course of the following description.

SUMMARY OF THE INVENTION

A coherent noise cancelling filter including an operational amplifier connected between a circuit input and a circuit output, and a feedback circuit connected from the output of the operational amplifier to the input thereof, with the feedback circuit including a digital filter and a low pass filter connected in series between the operational amplifier output and input. In the preferred embodiment, an integrating type digital filter in the feedback circuit including an analog-to-digital converter, a first memory, a second memory, an adder, and a digital-to-analog converter, with the first and second memories and adder connected in a series loop. In alternative embodiments, a digital filter with a condenser memory. A coherent noise cancelling filter incorporating a digital filter and timing circuitry for shifting data from memory to the output at a time prior to shifting data at the input or within the filter to provide compensation for a system time delay.

A process for cancelling coherent noise in a signal which has an information period and a no information period includes storing the signal in memory during a no information period and then during a subsequent information period, combining the stored signal with the then existing signal in cancelling relation, as by combining the stored signal with the existing signal at the input of an operational amplifier which provides the desired output signal and the input to memory.

DESCRIPTION OF THE PREFERRED EMBODIMENTS

Figure 1:
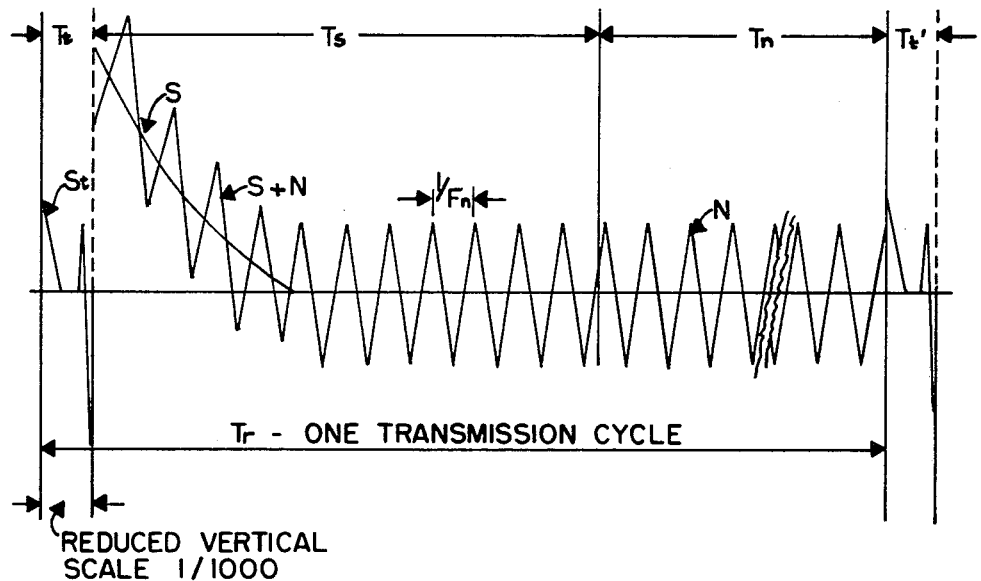
FIG. 1 is a diagram illustrating a typical input signal of a time-domain system with coherent noise.
Figure 2:
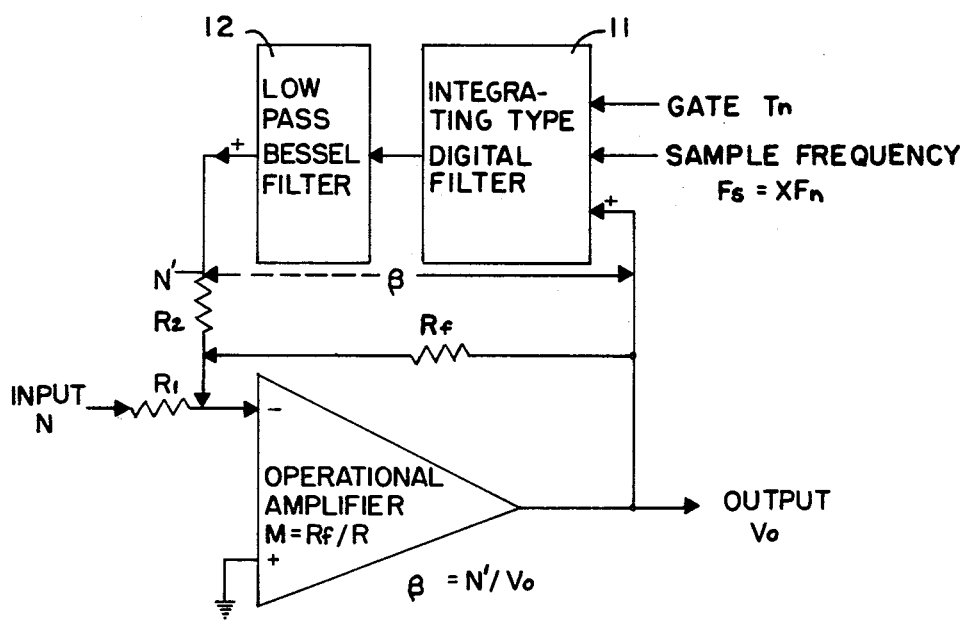
FIG. 2 is a block diagram of a coherent noise cancelling filter incorporating the presently preferred embodiment of the invention.

A coherent noise cancelling filter is illustrated in FIG. 2. The input N is connected to one input terminal of an operational amplifier 10, with the other input terminal connected to circuit ground. The output of the noise cancelling filter is the output of the operational amplifier Vo. The feedback circuit for the operational amplifier includes an integrating type digital filter 11 and a low pass filter 12, preferably a Bessel filter. Resistor Rf is connected between the operational amplifier output and input, resistor R1 is connected between the input to the circuit and the operational amplifier input, and resistor R2 is connected between the low pass filter output and the operational amplifier input. The gain M of the operational amplifier is Rf/R, where R equals R1 equals R2.

Figure 3:
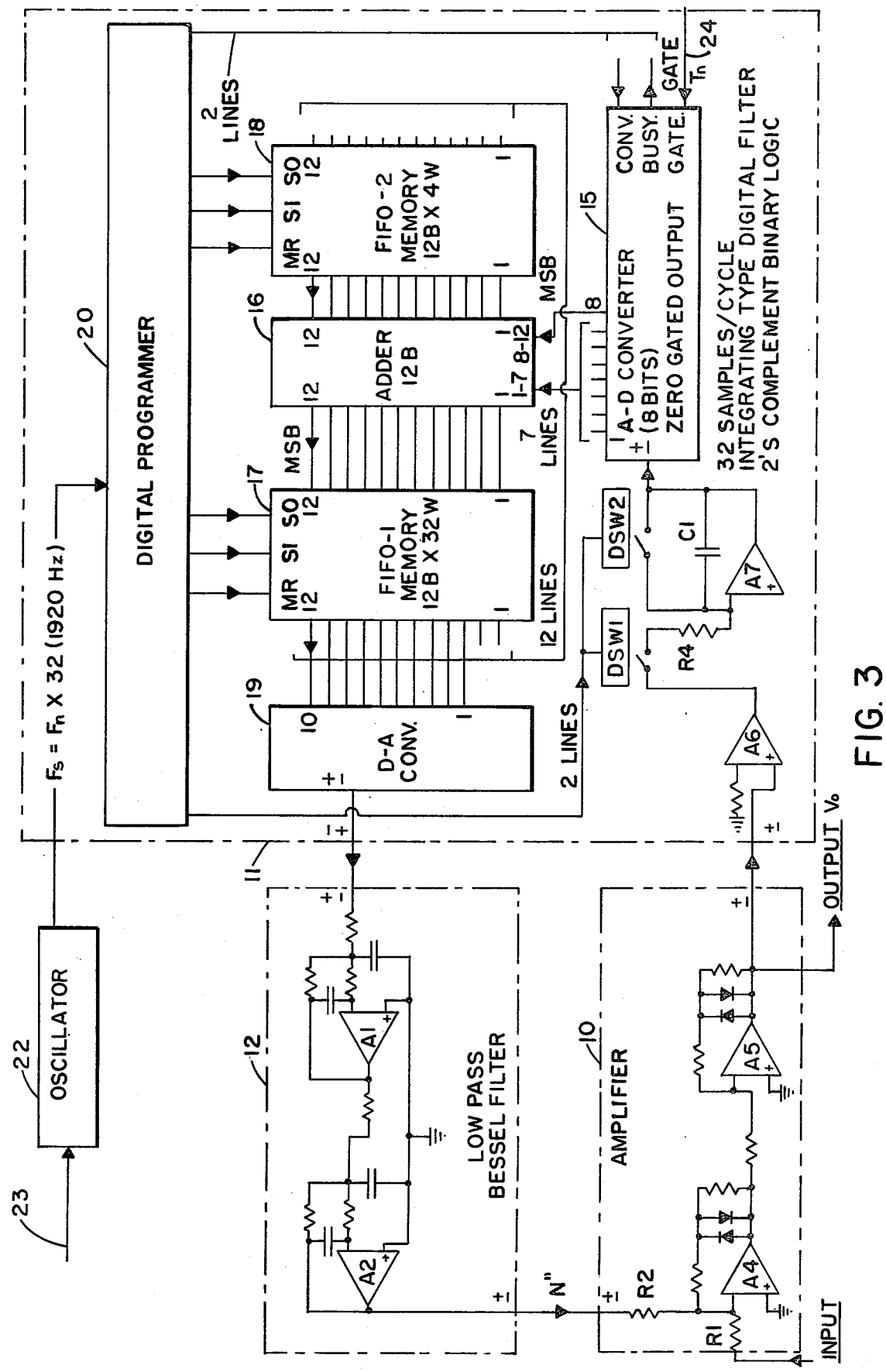
FIG. 3 is a block diagram showing the filter of FIG. 2 in greater detail and incorporating digital memories.
Figure 4:
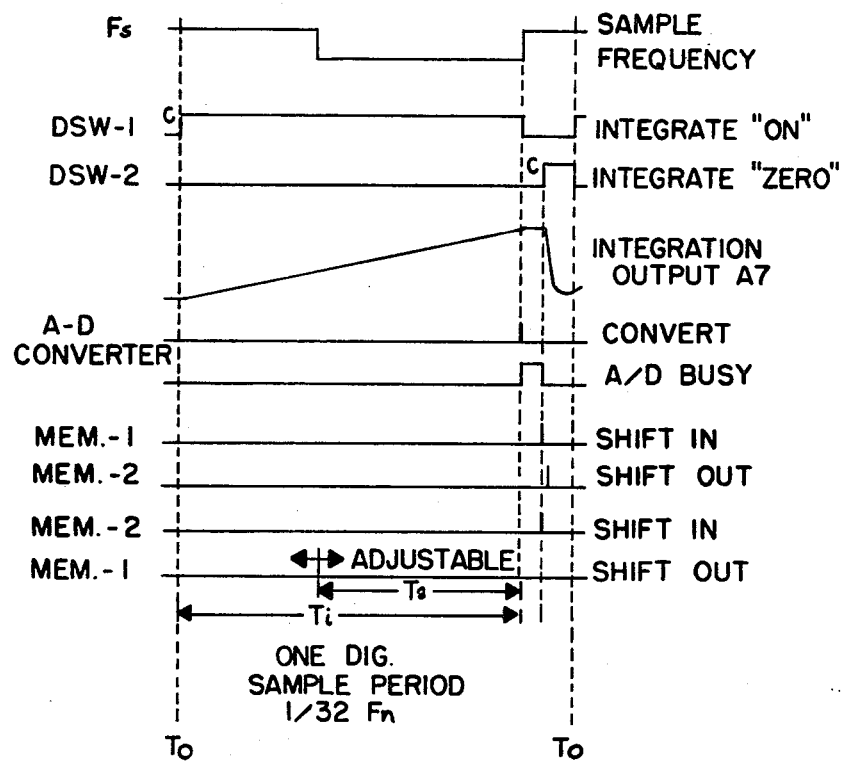
FIG. 4 is a timing diagram for the filter of FIG. 3.

A specific embodiment of the coherent noise cancelling filter of FIG. 2 incorporating digital memory is shown in FIG. 3. The operational amplifier 10 includes two stages A4 and A5. The low pass Bessel filter 12 includes two stages A1 and A2. The integrating type digital filter 11 includes a signal amplifier A6, an integrating amplifier A7, an analog-to-digital converter 15, an adder 16, a first memory 17, a second memory 18, a digital-to-analog converter 19, and a programmer 20. The various components may be conventional purchased parts, with the programmer 20 providing for timing of the operation. The timing diagram is set out in FIG. 4. The memories 17, 18 are digital first in first out memories, with the second memory 18, the adder 16 and the first memory 17 connected in a series loop. A switch DSW1 connects the output of the amplifier A6 to the input of the integrating amplifier A7. A switch DSW2 shunts the integrating capacitor C1 of the amplifier A7 to discharge the capacitor and zero the integrator. Both switches DSW1 and DSW2 are controlled by the programmer 20, with the sequence shown in FIG. 4. The sample frequency Fs is provided by an oscillator 22, and in the embodiment illustrated is 32 times the frequency of the coherent noise Fn. Where the noise frequency is known, such as a 60 hertz powerline noise, the oscillator 22 may be a crystal oscillator operating at a constant frequency. Where the noise frequency varies, as that produced by an engine driven generator, the oscillator 22 may be variable frequency oscillator with the output frequency controlled by a signal on input line 23, which signal varies with the frequency of the noise source.

In operation, data is stored into memory only during the time Tn so that the stored signal represents the coherent noise N only. A gate signal Tn on line 24 controls the A to D converter 15. Prior to the application of a gate signal the noise cancelling filter has attained a stable state where N" has cancelled N. Under these conditions, there is a "zero" digital output from the A to D converter and the memories 17, 18 are reproducing the signal N". A gate signal applied at 24 will hold the output of the A to D converter at "zero" digital output, and as long as this gate signal is applied, the signal N" will continue to be reproduced. The signal N" will continue at the same characteristic level independent of the later input which may contain N and $S_t$ and S. On the removal of the gate signal, the A to D converter will update N" before the next gate signal.

The time Tn may be an arbitraily chosen time duration at the end of a transmission cycle Tr selected so that the signal S will have decayed to zero prior to the start of time Tn.

The gate signal may be generated manually or automatically, as desired. An automatic source for the gate signal could be triggered by the transmitted pulse St, with a time delay Ts, so that Tn starts after S has dropped to zero.

The coherent noise signal N is cancelled with an identical signal N' before any non-linear amplification. This continuous cancelling signal N' has the character of of the coherent noise signal during the period Tn and is independent of St and S. Therefore, storage of the coherent noise signal during the period Tn for continuous reproduction provides the desired signal N'. A modified digital type filter is used to define the coherent noise signal and store this signal for continuous reproduction. The circuit is not a true digital filter and this circuit will be called an integrating type digital filter. The amplifier in this circuit should be wide-band (0–10,000 Hz) and have low phase distortion within the rejection band of the noise cancelling filter. The amplifier can have amplitude compression. This compression does not affect the attenuation but for high level noise, the time constant to attain attenuation is increased.

The coherent noise signal has a fundamental frequency and harmonics. The memory of the digital filter inherently limits the signal stored therein in that only the fundamental and the lower harmonics up to the limit of the memory can be stored. This upper limit can be selected by appropriate selection of components, depending upon the anticipated characteristics of the coherent noise likely to be encountered.

The coherent noise cancelling filter can be incorporated into an existing signal receiving system utilizing an amplifier of the existing system. Alternatively, the coherent noise cancelling filter with its own amplifier can be inserted into a signal receiving system.

The timing function of the integrating type digital filter 11 is provided by the programmer 20. The fundamental noise cycle of frequency Fn is divided into a number of preselected samples (32) of equal time width W. If Fn=60 Hz, the sample frequency Fs=60×32=1920 Hz. This input sample frequency can be obtained from a crystal oscillator or a phase-locked oscillator to maintain constant coherence with the 60 Hz noise. There are a number of programmer timing functions which are repeated during each sample. As these functions are described, reference can be made to FIGS. 3 and 4.

The digital filter input signal is adjusted in level by amplifier A6. At the beginning of each window time, the integrator A7 has been set to zero with digital switch 1 "open" (DSW1=0) and digital switch 2 "closed" (DSW2=C)). Then (DSW1=C) and (DSW2=0) starts integration. Integration is performed for a period Ti, then (DSW2=0) and (DSW1=0) holds the integrator output. At this point the output voltage is the average of the input during Ti. A "convert" command is then given to the A-D converter 15. At the completion of the conversion as defined by a "busy" signal, the integration is returned to the zero mode (DSW1=0) and (DWS2=C) and the A-D converter output is fed to one set of inputs of the adder 16.

The two FIFO memories 17, 18 and the adder 16 are connected in a series loop. The input to this loop is fed to one set of adder inputs. The output is obtained from the junction of the two FIFO's. This junction point is a tap on the total memory which provides advanced timing for the output. This advanced timing compensates for the time delays of the Bessel filter 12 and the digital filter 11.

The FIFO memories consist of a number of shift registers (12B for FIFO-1) and a number of sections (32W for FIFO-1). Each register handles a bit of input data for one digital level. All registers shift simultaneously to shift a byte or sample reading and all bytes in the memory shift simultaneously with a shift out command. The shift out control (SO) removes the earliest byte from memory output. The shift in control (SI) captures the byte at the input and locates it in the memory stack adjacent to the previous byte.

At the time of energizing the system, the programmer must reset the memories (MR) and preset the number of bytes in each memory. The memory-adder loop operates to circulate a fixed number of bytes (32) and this is the minimum number of bytes in storage. At the time of data entry for a sample (1–32) the reading X is added to the sum of the previous readings ΣX for the same sample (1–32). Since the adjacent shift controls in the loop (SI1 vs. SO2) and (SI2 vs. SO1) do not have simultaneous timing, the memories require a total byte capability of 34. At the time of data entry for a sample X (1–32), the sample X is added to ΣX for the same sample interval (1–32). Adjustment of SO1 gives a fine control on the advance of output time.

The lead time or advance of output over input may be determined as follows. Where the minimum number of words in memories is 32, let J be the minimum number of words in memory 2 (18). Then the lead time is $$\left| Ta - \frac{Ti}{2} = \frac{J-1}{Fs} \right| 10^3 \text{ msec.}$$

At time To with J=2, there are 31 words in memory 1 (17) and 2 words in memory 2 (18).

Note that the A-D 15 and the D-A 19 have different bit handling capabilities and their entry and exit levels are different. The incremental output accuracy is determined by the D-A if the LSB of the D-A is equal or above the LSB of the A-D. The lowering of the MSB of the A-D lowers the gain ($\div 16$) the maximum effect ($\div 16$) of X on $\Sigma X + X$. The loss of gain can be recovered in the amplifier A6.

With the adder in the loop, the digital type filter becomes integrating and must have external restraint. A constant input level would be additive and would exceed the dynamic range of the output. The use of this filter as a negative feedback element provides this restraint.

When the output of the A-D converter is gated "off" to give a zero digital signal output, the memory section continues the output signal N" from the bytes in the memories. When the output of the A-D is gated "on", the system resumes its up-dating of the signal N".

Figure 5:
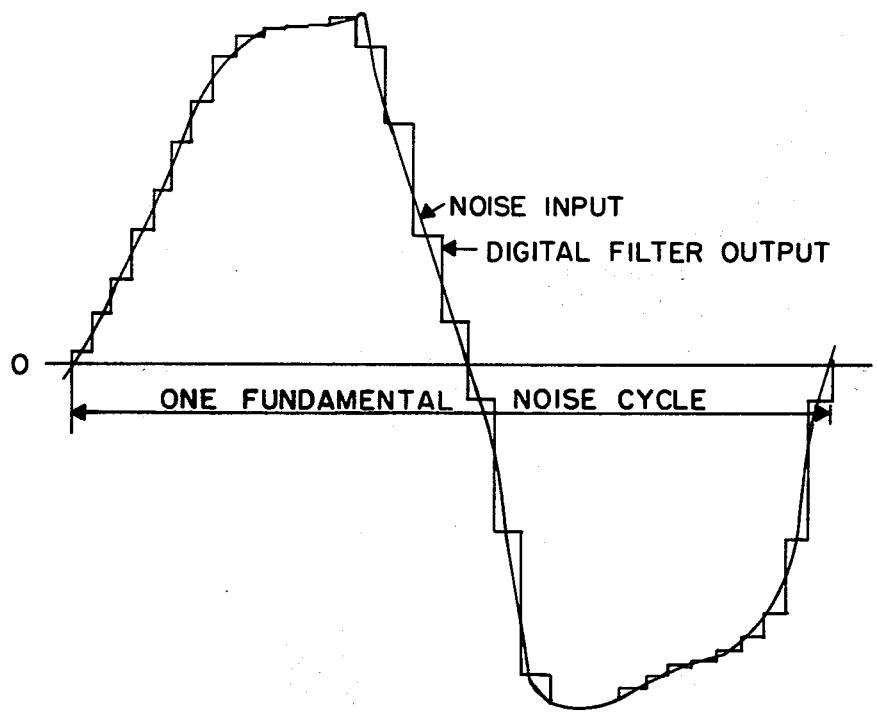
FIG. 5 is a waveform illustrating the output of the filter of FIG. 3.

The digital data from the memory are reconstructed in analog form by the D-A converter. The output from the D-A is a filtered reconstruction of the input to the digital filter. The analog output is a stepped representation of the input for 32 equal intervals (see FIG. 5). The purpose of the low pass filter 12 is to remove the artificial noise introduced by the stepped output from memory. The output of the low pass filter should then match the coherent input noise signal. This output signal is the required cancelling signal N" and has opposing phase to the noise N. N" in FIG. 3 corresponds to N' in FIG. 2.

The amplifiers A4 and A5 provide the amplifier of the coherent noise cancelling filter. These amplifiers are illustrated as amplitude compressors. The coherent noise N is summed in the feedback loop until N" cancels N and the coherent noise approaches zero within the incremental accuracy of the D-A converter.

The zero for the coherent noise and DC is defined by zero digital output from the A-D converter. The DC offset at the noise cancelling filter output is therefore dependent on the effective combined DC offsets of A6, A7 and the A-D converter. There is automatic correction for all other DC offsets including the input signals. Also there is automatic compensation for long term drifts of the reference voltage of the converters.

Digital filtering is used in the processing of data by computers and the theory of digital filters is well-known. Real-time digital filters may be realized with digital components.

In the circuit of the present invention, the objective is to reproduce a distorted waveform having a defined repetitive rate Fn using digital filtering for Fn. A cycle of Fn is sampled at a rate Fs which is an integral multiple of Fn. As the sampling rate is increased, the resolution of the output is improved for a coherent (i.e. repetitive) input. This resolution is independent of any numerical knowledge of the harmonic frequencies and their integral ratio to the sample frequency Fs.

A practical real-time digital filter must have a finite sampling frequency. To select this frequency a knowledge of the harmonic content is essential. To reproduce any frequency with intelligence, more than two samples are required and the sampling frequency is chosen on this basis.

The output signal from the digital filter is a stepped reproduction of the desired waveform. Mathematically these steps represent the intermodulation products of the sample frequency and the input waveform N. For the present invention, these artificial frequencies of Fs/2 and higher must be attenuated. The undesired intermodulation high frequencies can be attenuated with a low-pass filter which introduces a fixed time lag and has a substantially constant time delay in the pass band.

It is intended that the digital filter be a filter which has pass-band characteristics for the coherent frequencies of the noise. If the filter is used as a negative feedback element with an amplifier, the resulting system has band rejection for the coherent signals or, alternatively stated, the output of the digital filter is used to cancel the coherent noise by providing a signal N'.

The inherent storage characteristics of the digital filter provide for compensating the constant time lags of the low pass filter and the digital filter. The output timing vs. the input timing can be varied to simulate a constant time lead.

For the feedback system to operate successfully, it is essential that the phase of all frequencies be maintained in the feedback loop for negative feedback and there can be no phase shift in the pass band to provide positive feedback. Positive feedback results in instability and possible oscillatory operation.

Therefore the characteristics of the digital filter and the low pass filter can be combined to provide the required feedback element. Since a digital filter carries its output in storage, and the input can be removed in a manner which permits a stable memory, the input can be gated for an output referenced to any period of input.

The low pass filter 12 is a filter which has a constant time delay in the pass band and this constant delay extends during the transition to the rejection band. This type of filter, when combined with an appropriate digital filter, can provide a pass band for coherent noise with no time delay (i.e. no phase shift for the coherent frequencies). The low pass filter is used to attenuate the artificial high frequency noise of the digital filter. A Bessel type low pass filter is preferred. It is essential that the phase shift of the combined filters be sufficiently low for stability in the pass-band and its extension when the combination is used as a negative feedback element. The detail design of the Bessel filter is dictated by attenuation of a coherent frequency band, sampling frequency of the digital filter, and attenuation of the artificial noise. Within the framework a "true" Bessel filter with exactly constant time delay may not be required but with conventional "block circuit" design this technique can be applied conveniently.

Figure 6:
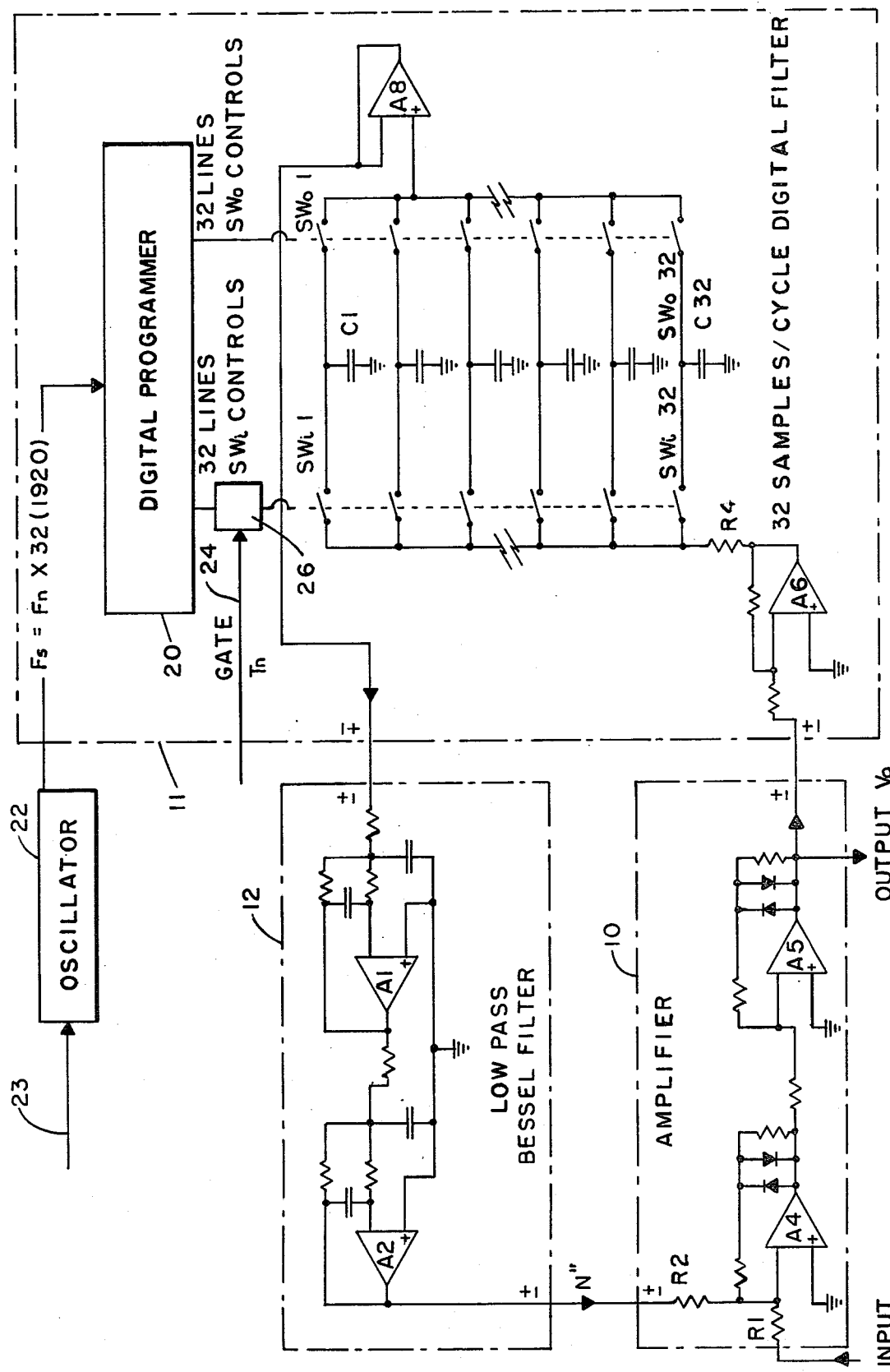
FIG. 6 is a diagram similar to that of FIG. 3 illustrating an alternative embodiment of the invention with condenser memory.
Figure 7:
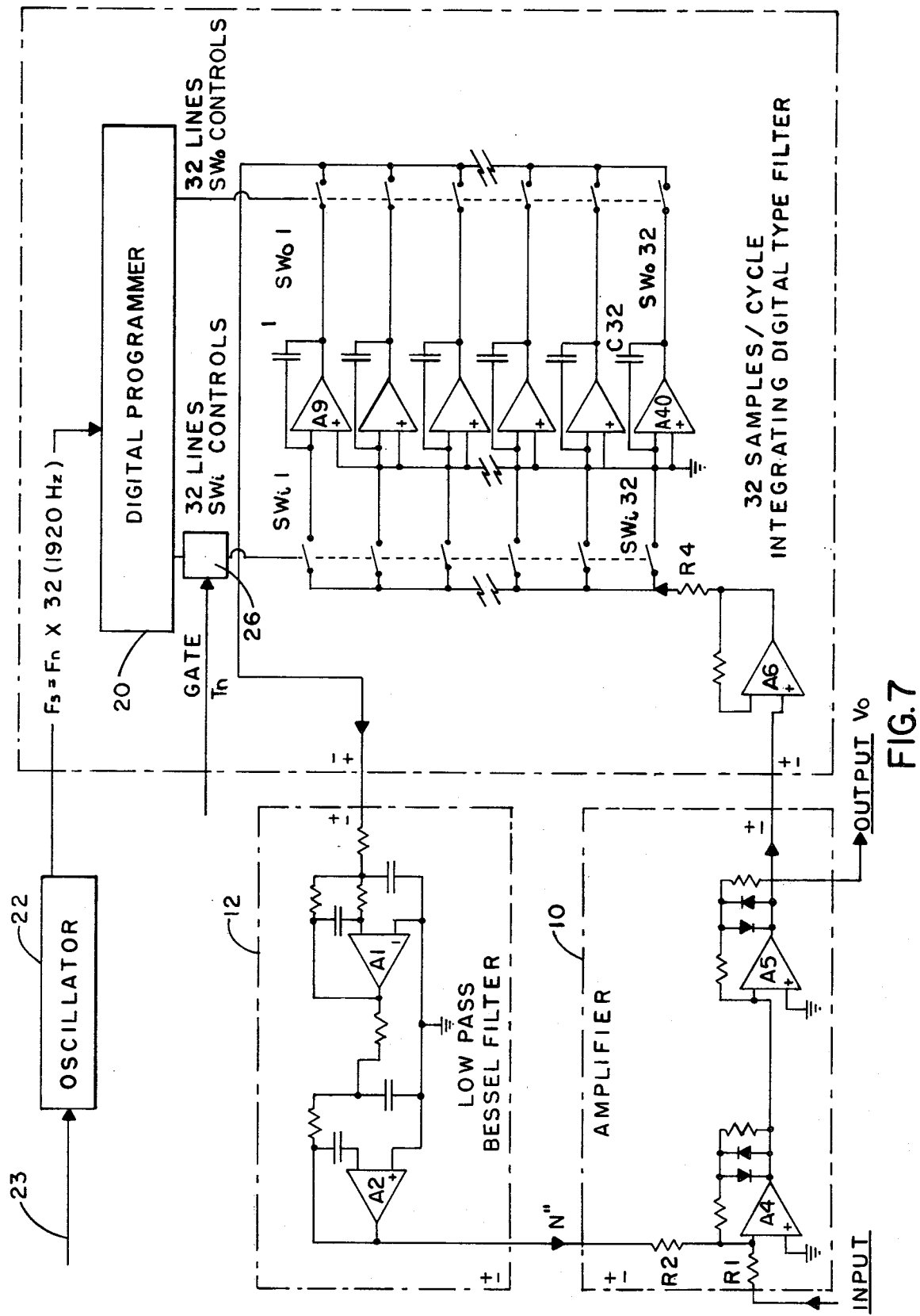
FIG. 7 is a diagram similar to that of FIG. 6 illustrating another alternative embodiment with integrating condenser memory.
Figure 8:
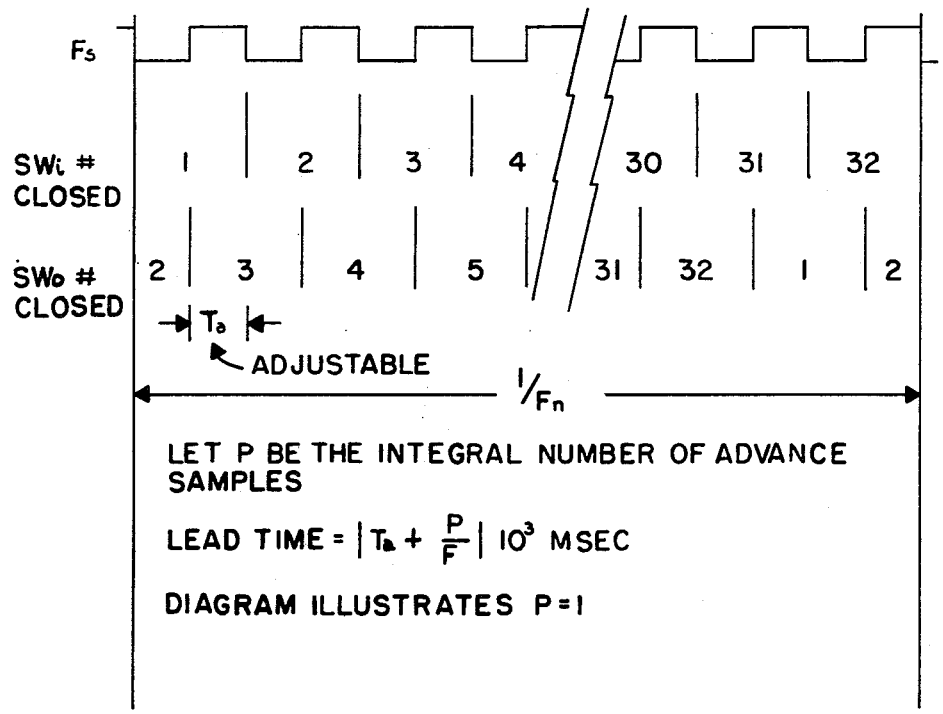
FIG. 8 is a timing diagram for the filters of FIGS. 6 and 7.

Alternative embodiments for the coherent noise cancelling filter utilizing condenser memory in the integrating type digital filter are shown in FIGS. 6 and 7, with the timing for the filter SWi and SWo being shown in FIG. 8. Components corresponding to those of FIG. 3 are identified by the same reference numberals. Digital filters with condenser memories are not new, and reference may be made to the prior art for details of construction and operation of this type of filter.

In the preceding discussion, the digital filter of FIG. 3 has been referred to as an integrating type digital filter because it is not a true digital filter. The filter of FIG. 6 is a true digital filter and is not integrating. The maximum attenuation of noise is dependent on the loop gain of the amplifiers A1, A2, A4, A5, A6 and A8. The response time constant is dependent on this gain and the time constants R4C1–R4C32. The attenuation and the response time are interdependent.

The digital filter of FIG. 7 incorporates an operational amplifier connected as a integrator for each sample, indicated as A9–A40 and C1–C32. With the integrating feedback of the filter of FIG. 3 and the filter of FIG. 7, the attenuation is high and the amplifier gains have a major effect on response time.

Time delay compensation is obtained by having the output switch SWo close prior to closing of the corresponding input switch, with the time interval being adjustable to obtain the desired lead time.

The input to the filter is gated off during times $T_t$ and Ts and on during time Tn. This may be accomplished by means of a switching circuit 26 between the programmer 20 and input switches Swi 1–32 so that all the input switches are maintained open during times $T_t$ and Ts. As an alternative embodiment, the control for holding the input switches open may be incorporated in the programmer.

In another alternative embodiment, a microprocessor may be substituted for the discrete components 16, 17, 18 and 20.

The circuit of FIG. 3 utilizing the digital type memory is preferred for most applications, since the condenser type memory exhibits leakage. However there may be some applications wherein this leakage is not a serious factor and the condenser memory digital filter can be utilized.

In these systems there is a limit on the attenuation of the low pass filter as Fs/2–960 Hz for stability. A practical solution for this instability is an attenuation of 6–12 db at 960 Hz for the low pass filter and an overcorrection for the filter delay. This increased lead time should provide an additional phase lead of 45–90 degrees at 960 Hz. In the FIG. 3 circuit a 4 pole Bessel filter for 290 Hz is used having a delay time of 540 microseconds. In this system a digital type filter lead time of 640 microseconds is used. To perform this adjustment and observe the effect, a 60 Hz square wave input was fed to the filter and the output was examined for attenuation and stability. It could be observed that with a lead time 540 microseconds, there was a transient output of 960 Hz commencing with the square wave reversals. As the advance timing was increased, the time constant of the transients decreased. This change does not affect the noise cancelling filter rejection in the design pass band.

In the practical application of a coherent noise cancelling filter, the "ideal" performance is degraded since there is a lag time-constant in establishing the cancelling signal N". This time-constant is inversely related to the gain of the feedback loop and adjustable by the gain of A6. This degrading occurs during a change of amplitude or phase of the coherent noise N. The formulae for calculation of an optimum filter time-constant have not been completed. These formulations involve both the coherent noise cancelling filter and the instrument with which the filter is used.

The time constant for a particular noise cancelling filter can be selected to obtain optimum operation for the filter and the particular instrument with which it is operated.

The coherent noise cancelling filter has a number of features which make it desirable for geophysical instruments of time-domain systems for electromagnetic, resistivity, and induced polarization measurements, and in similar systems such as radar, seismic and sonar. The filter provides coherent rejection for a noise frequency and its harmonics. There is inherent DC stabilization. The filter provides a gated mode of operation. A noise cancelling signal N" is obtained from sampling during the absence of system signals; this signal is stored and used during the reading period of the desired signal. When the filter is gated, there is no effect on the normal signal processing characteristics of the instrument.

Optimum rejection is obtainable when the defined noise signal is constant in amplitude and frequency. The noise rejection characteristics deteriorate somewhat during amplitude and phase changes of the noise. The rejection during these changes can be optimized by varying the response time of the filters vs. the probable variation characteristics of the noise. Favorable conditions exist for this filter in the majority of areas having high 60 Hz noise. In most areas serviced by the large power network, the 60 Hz frequency is adequately constant to use a crystal controlled sampling oscillator. When the coherent noise frequency is variable, the sampling oscillator can be phase-locked to the noise frequency. The operation is not restricted to 60 Hz coherent noise.

The performance of the noise cancelling filter is dependent on negative feedback determined by a digital type filter. This digital type filter defines the coherent noise band and provides memory storage of a signal N". The relative input and output phases of all coherent noise frequencies is maintained in the digital type filter. The constant time lag of a digital type filter and a low pass filter is removed by adjustment of the output timing from the digital memory. This combination minimizes the artificial noise of the digital type filter.

| Summary of Abbreviations | |
| --- | --- |
| A | Operational Amplifier with numerical suffix |
| A-D | Analog to Digital |
| B | Digital Bits |
| C | Capacity in Microfarads. Indicates closed when describing switch condition SW1=C. |
| CW | Continuous Wave |
| D-A | Digital to Analog |
| DSW | Digital Switch |
| F | Frequency in Hertz |
| Fn | Fundamental Coherent Noise Frequency |
| Fs | Noise Sample Frequency (32Fn) |
| FIFO | First in First Out Digital Memory |
| Hz | Hertz |
| I | Current in amperes |
| J | Constant as defined |
| L | Inductance in henries |
| N | Coherent Noise Level |
| 0 | Zero. Indicates open when describing switch condition (SW1=0) |
| P | Constant as defined |
| R | Resistor (ohms) with numerical suffix |
| S | Received desired signal level |
| S' | Peak level of S |
| St | Transmitted signal level |
| SI | SHIFT IN - of FIFO, numerical suffix |
| SO | SHIFT OUT - of FIFO, numerical suffix |
| SW | Switch with numerical suffix |
| T | Time |
| Tt | Transmitter signal time |
| Ts | Period reserved to examining received signal S |
| Tn | Period reserved to examining coherent noise, St = S = 0. |
| Ti | Sample integration time of N |
| V | Voltage as defined |
| W | Time width of noise sample = 1/Fs |

-continued

| Summary of Abbreviations | |
|---|---|
| w | $2\pi F$ frequency in radians per second |

I claim:

1. In a coherent noise cancelling filter, the combination of:
   means defining a circuit input and a circuit output;
   an operational amplifier connected between said circuit input and circuit output;
   a feedback circuit connected from the output of said operational amplifier to the input thereof, said feedback circuit including a digital filter and a low pass filter connected in series between said operational amplifier output and input, said digital filter including memory means and first switching means for connecting said operational amplifier to said memory means; and
   timing means for operating said first switching means to interconnect said operational amplifier output and said memory means during a predetermined time.

2. A coherent noise cancelling filter as defined in claim 1 wherein said digital filter is an integrating type digital filter.

3. A coherent noise cancelling filter as defined in claim 2 wherein said digital filter includes an integrator between said first switching means and said memory means.

4. A coherent noise cancelling filter as defined in claim 3 wherein said integrator includes a capacitor, and said digital filter includes
   second switching means for shunting said capacitor, and
   said timing means includes means for closing first switching means during an integrating period and then opening said first switching means and closing said second switching means at a subsequent time to set said integrator to the zero state.

5. A coherent noise cancelling filter as defined in claim 3 wherein said digital filter includes an analog-to-digital converter, an adder, and a digital-to-analog converter, and said memory means includes a first memory and a second memory, with said first and second memories and adder connected in a series loop,
   means connecting the output of said integrator as an input to said analog-to-digital converter,
   means connecting the output of said analog-to-digital converter as an input to said adder, and
   means connecting the junction of said memories as an input to said digital-to-analog converter.

6. A coherent noise cancelling filter as defined in claim 5 wherein said low pass filter has a substantially constant time delay in its pass band, and including means connecting the output of said digital-to-analog converter as an input to said low pass filter.

7. A coherent noise cancelling filter as defined in claim 6 wherein said low pass filter is a Bessel filter.

8. A coherent noise cancelling filter as defined in claim 5 including timing means for shifting data from said first memory to said digital-to-analog converter prior to shifting data from said first memory to said second memory.

9. A coherent noise cancelling filter as defined in claim 8 wherein said first and second memories are first in first out memories.

10. A coherent noise cancelling filter as defined in claim 3 including an oscillator providing clock signals for said timing means.

11. A coherent noise cancelling filter as defined in claim 10 wherein said oscillator operates at a fixed frequency.

12. A coherent noise cancelling filter as defined in claim 10 wherein said oscillator operates at a variable frequency related to the frequency of the coherent noise.

13. A coherent noise cancelling filter as defined in claim 2 wherein said low pass filter has a substantially constant time delay in its pass band, and including means connecting the output of said digital filter as an input to said low pass filter.

14. A coherent noise cancelling filter as defined in claim 13 wherein said low pass filter is a Bessel filter.

15. A coherent noise cancelling filter as defined in claim 1 wherein said digital filter includes an analog-to-digital converter, and said timing means includes means for controlling the output of said converter.

16. A coherent noise cancelling filter as defined in claim 1 including means for reading data from said memory means and for writing data in said memory means, and means for varying the time between said reading and writing operations.

17. A coherent noise cancelling filter as defined in claim 1 wherein said digital filter memory means includes a plurality of condenser memory units, and corresponding input and output switches for each condenser memory unit, said first switching means including said input switches,
   circuit means for connecting each of said output switches to said low pass filter, and
   said timing means including means for closing said input switches in sequence and said output switches in sequence.

18. A coherent noise cancelling filter as defined in claim 17 wherein said condenser memory units includes a condenser connected to circuit ground.

19. A coherent noise cancelling filter as defined in claim 17 wherein said condenser memory units includes an operational amplifier connected as an integrator.

20. A process for cancelling coherent noise in a signal which has an information period and a no information period, said noise havng a fundamental frequency and harmonics thereof, including the steps of:
   during a no information period, storing the signal, including the noise fundamental and lower harmonics, in memory; and
   during a subsequent information period, combining the stored signal with the then existing signal in cancelling relation providing the desired output signal.

21. The process as defined in claim 20 including during the no information period,
   integrating the output signal during an integrating period prior to storage in memory,
   converting the integration result to a digital value, and
   storing the digital value in memory to provide the stored signal.

22. The process as defined in claim 21 including during both of said periods converting the output from memory to an analog signal, and
   filtering the analog signal to remove higher harmonics.

23. The process as defined in claim 22 including during both of said periods transferring data from a first memory unit of the memory to a second memory unit of the memory of a first time and transferring the data from the first memory unit to a digital-to-analog converter at a second time prior to said first time to provide a compensation for system delay.

24. The process as defined in claim 20 including during the no information period dividing the signal to be stored into a plurality of time segments and storing each time segment separately in sequence in memory.

25. The process as defined in claim 24 inclduing storing each signal time segment in a condenser.

26. The process as defined in claim 24 including storing each signal time segment in an integrating amplifier.

27. The process as defined in claim 24 including storing each signal time segment in a digital first in first out memory.

28. The process as defined in claim 24 including during both of said periods reading each stored signal time segment from memory separately in sequence.

29. The process as defined in claim 28 including varying the time between reading from memory and storing in memory to provide compensation for system delay.

* * * * *